(12) United States Patent
Huang et al.

(10) Patent No.: US 6,891,216 B1
(45) Date of Patent: May 10, 2005

(54) TEST STRUCTURE OF DRAM

(75) Inventors: Chien-Chang Huang, Taipei (TW); Tie-Jiang Wu, Ilan (TW); Chin-Ling Huang, Taipei (TW); Yu-Wei Ting, Taipei (TW); Bo-Ching Jiang, Hualien (TW)

(73) Assignee: Nanya Technology Corporation, Taoyuan (TW)

( * ) Notice: Subject to any disclaimer, the term of this patent is extended or adjusted under 35 U.S.C. 154(b) by 0 days.

(21) Appl. No.: 10/664,163

(22) Filed: Sep. 17, 2003

(30) Foreign Application Priority Data

Jan. 9, 2003 (TW) ........................ 92100402 A

(51) Int. Cl.[7] ............... H01L 31/119; H01L 29/94; H01L 29/76; H01L 27/108
(52) U.S. Cl. ............... 257/305; 257/304; 257/302; 257/301
(58) Field of Search ............... 257/48, 301, 302, 257/304, 305

(56) References Cited

U.S. PATENT DOCUMENTS

| | | | | |
|---|---|---|---|---|
| 4,905,065 A | * | 2/1990 | Selcuk et al. | 257/301 |
| 4,921,815 A | * | 5/1990 | Miyazawa | 438/248 |
| 5,225,698 A | * | 7/1993 | Kim et al. | 257/303 |
| 5,250,829 A | * | 10/1993 | Bronner et al. | 257/301 |
| 5,264,716 A | * | 11/1993 | Kenney | 257/301 |
| 5,798,545 A | * | 8/1998 | Iwasa et al. | 257/301 |
| 2003/0178661 A1 | * | 9/2003 | Tzeng et al. | 257/301 |

* cited by examiner

*Primary Examiner*—Nathan J. Flynn
*Assistant Examiner*—Victor A. Mandala Jr.
(74) *Attorney, Agent, or Firm*—Birch, Stewart, Kolasch & Birch, LLP

(57) ABSTRACT

A test structure of a DRAM array includes a substrate. A transistor is formed on the substrate and has a first region and a second region as source/drain regions thereof. A deep trench capacitor is formed adjacent to the transistor and has a first width. A shallow trench isolation is formed in a top portion of the deep trench capacitor and has a second width. The second width is substantially shorter than the first one. A third region is formed adjacent to the deep trench capacitor. A first contact is formed on the substrate and contacts with the first region. A second contact is formed on the substrate and contacts with the third region.

13 Claims, 3 Drawing Sheets

US 6,891,216 B1

TEST STRUCTURE OF DRAM

This Application claims priority to Taiwan Patent Application No. 092100402 filed on Jan. 9, 2003.

FIELD OF INVENTION

The present application relates to a test structure of a semi-conductor, in particular, a test structure of DRAM.

BACKGROUND OF THE INVENTION

In the process of producing semi-conductor devices, it takes many steps to form the desired devices. In the process of forming DRAM, for example, it takes many steps to form a capacitor and a transistor to build up a memory cell. To ensure the structures are correctly formed on the wafer by those steps, there are usually test structures on the wafers. During the steps, the correctness of the structures of the devices on the wafers is ensured by detecting the electric polarity or other features of the test structure.

FIG. 1 is a cross-sectional view of a test structure on a wafer using to form a DRAM in the prior art. In a substrate 100, a first deep trench capacitor 102 and a second deep trench capacitor 104 are formed. A first gate contact 110 and a second source/drain 118, 120 form a transistor. A second gate contact 116 and a second source/drain 126, 128 form another transistor. A first buried strap 122 is formed adjacent to the first deep trench capacitor 102. A second buried strap 124 is formed adjacent to the second deep trench capacitor 104. By means of a first contact 106 and a second contact 108, the threshold voltage Vt of the transistor is detected to check if the structure on the wafer is correct. For example, a drift formed by the contact of the trench and the gate may contribute to the decrease of threshold voltage Vt.

The active area AA1 in the structure of FIG. 1 is larger than the normal active area of a memory cell. It cannot reflect the actual situation of the active area of a memory cell, and requires to encompass more buried straps. When buried straps have out diffusion effect, the threshold voltage will be affected, too. Subsequently, when using the structure of FIG. 1 to test the structure of DRAMs, the problems on the wafer cannot be identified because too many variables are involved.

SUMMARY OF THE INVENTION

The object of the present invention is to provide a test structure of DRAM, in order to provide a test structure which much more resembles the active area of actual memory cell.

The present invention provides a test structure which is formed on a semi-conductor substrate for DRAM. A transistor is formed on a semi-conductor substrate and includes a first region and a second region, which are formed in the semi-conductor substrate as source/drain of the transistor. A deep trench capacitor, which is formed in the semi-conductor substrate and adjacent to the transistors, has a first width. A shallow trench insulator (STI), which is formed in a top portion of the deep trench capacitor, has a second width. The second width is substantially shorter than the first width. A third region is formed in the semiconductor substrate and adjacent to the deep trench capacitor. A first contact is formed on the semiconductor substrate and is in contact with the first region. A second contact is formed on said semiconductor substrate and is in contact with the third region. By measuring the threshold voltage of the transistor through the first contact and the second contact, whether the structure is correct or not is thus detected.

DETAILED DESCRIPTION

The present invention provides a test structure of DRAM on a wafer. The test structure has an active area which much more resembles the actual memory cell to determine if each structure of each step is correctly configured.

Figure 2:
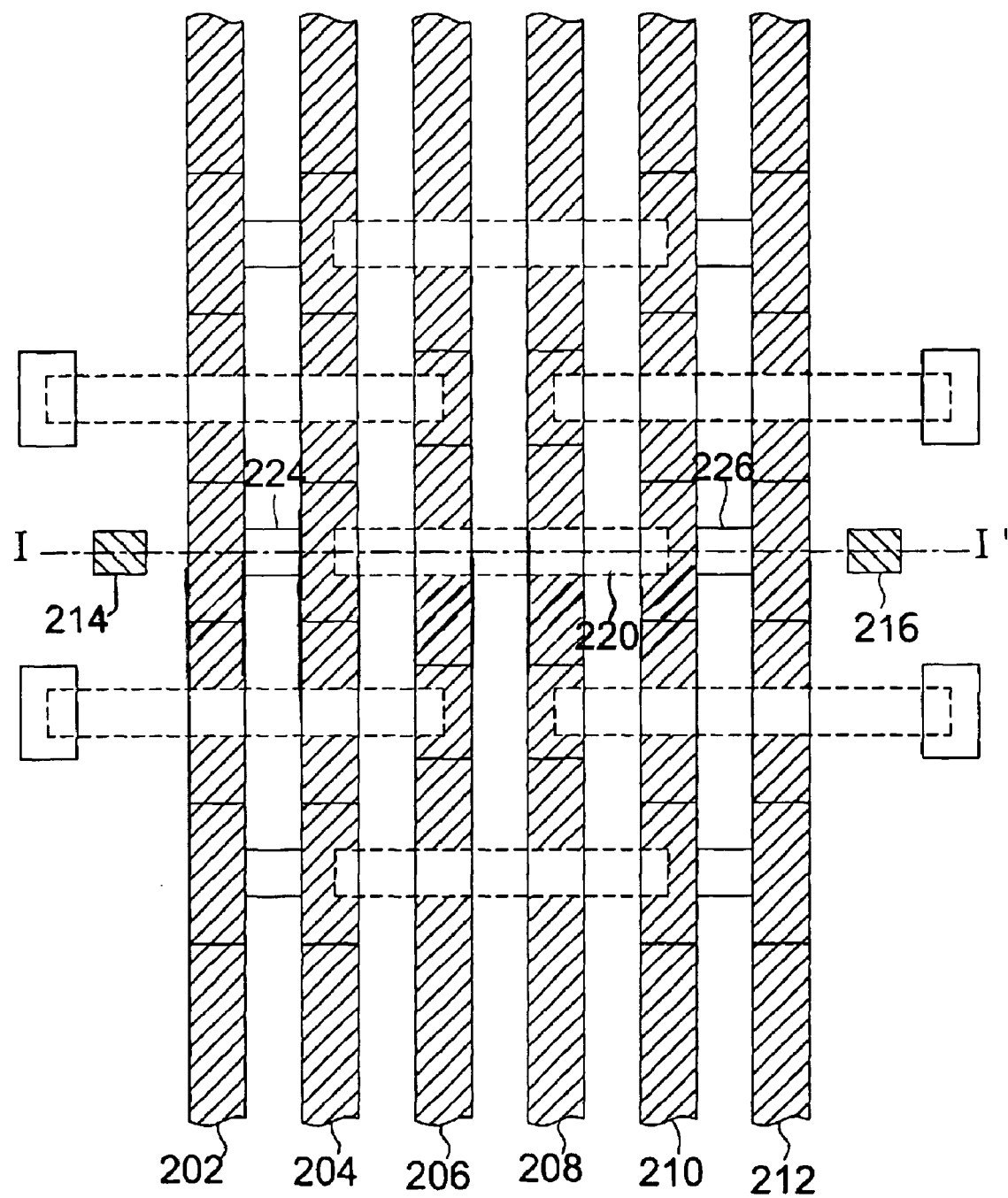
FIG. 2 illustrates a test lay-out of DRAM of the present invention.

FIG. 2 illustrates a lay-out of test structure of the present invention. Below Active Area 220, a third gate contact 206 and a fourth gate contact 208 are formed. A first deep trench capacitor 224 in the shape of the letter H is formed under the first gate contact 202 and the second gate contact 204. A second deep trench capacitor 226 in the shape of the letter H is formed under the fifth gate contact 210 and the sixth gate contact 212. A first contact 214 is formed on one side of the first gate contact, and a third contact 216 is formed on one side of the sixth gate contact 212. A second gate contact (not shown here) is formed below the Active Area 220 and between the third gate contact 206 and the fourth gate contact 208. Along the cross-sectional line I–I' is the cross-sectional view of the test structure as shown in FIG. 3.

Figure 3:
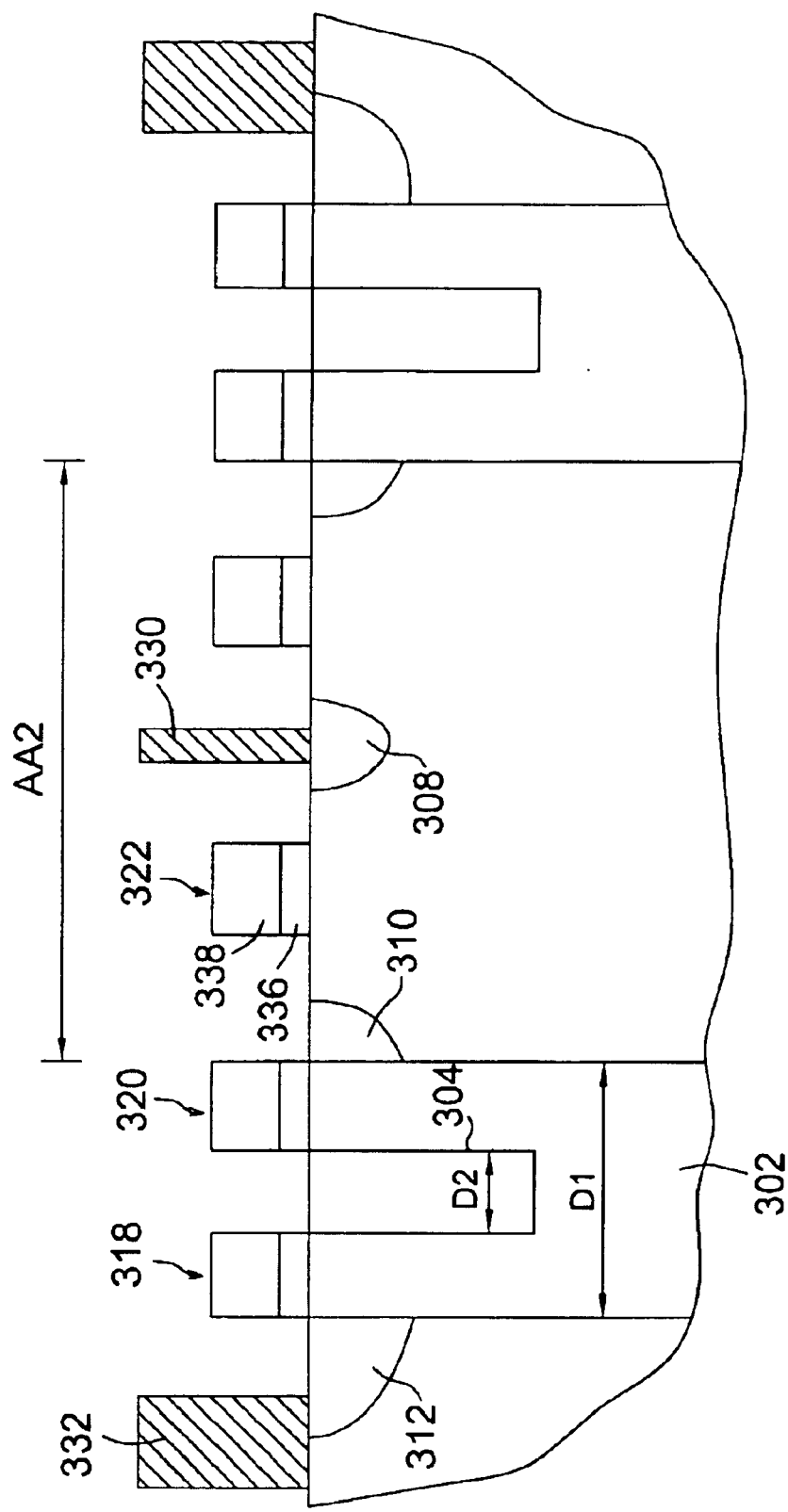
FIG. 3 illustrates a cross-sectional view of the test structure of the present invention.

Along the cross-sectional line I–I' in FIG. 2 is the cross-sectional view of test structure of FIG. 3. The preferable material of semiconductor substrate 300 is silicon. Using a first contact 330 as a border, on semiconductor substrate 300 one device is placed on each side. The two devices on both sides share a first contact 330 and a first region 308. Taking the left device for example, the first region 308 and the second region 310 are formed within semiconductor substrate 300. The first region 308 and the second region 310 act as source/drain regions of the transistor. The third gate contact 322 as well as a silicon oxide layer 336 is formed on the semiconductor substrate 300. Next, a conduction layer 338 is formed on the silicon oxide layer 336. The conduction layer 338 is preferably made of metal silicide. Third gate contact 322, the first region 308 and the second region 310 make up a transistor.

As shown in FIG. 3, among the left devices, the deep trench capacitor 302 is formed within the semiconductor substrate 300 and adjacent to the aforesaid transistor. The deep trench capacitor 302 has a first width D1.

The shallow trench isolation (STI) is formed in a top portion of the deep trench capacitor 302. The STI has a second width D2. As indicated in FIG. 3, the second width D2 is substantially shorter than the first width D2. The structure of the first gate contact 318 and the second gate contact 320 are the same as that of the third gate contact 322, so, no more details are provided here.

The third region in FIG. 3, being possibly a buried strap, is formed within the semiconductor substrate 300 and adjacent to the first deep trench capacitor 302. The first region 308, the second region 310 and the third region 312 are formed by doping proper dopant(s) into the semiconductor substrate 300. The first contact 330 is formed on the semiconductor substrate 300 and is in contact with the first region 308. The second contact is formed on the semiconductor substrate 300 and is in contact with the third region 308. The gate contact in FIG. 3 is connected to the active word line and the passive word line, respectively. Taking the left device for example, the first gate contact 308 and the second gate contact 320 connect to the passive word line, respectively. The third gate contact 322 connects to the active word line.

When the test structure in FIG. 3 is used to test the structures of DRAMs on wafers, the first contact 330 and the second contact 332 are used to measure the threshold voltage Vt of the transistor. Once the Vt changes, it indicates that the structures of wafers are possibly shifted during processing. Decrease of the Vt is caused by the shift of the trench capacitor 302, the first gate contact 318 and the second gate contact 320. The area of the effective region 220 in FIG. 2 and the effective region AA2 in FIG. 3 are the same size as the actual memory cells. In the previous test structure in FIG. 1, the fourth gate contact 116 is moved to overlap with the first gate contact 110 to form the structure in FIG. 3. Compare the test structure in FIG. 3 with the previous one in FIG. 1, two buried straps are cancelled along the test path. The change of Vt can be more sensitively detected due to such modification.

Figure 1:
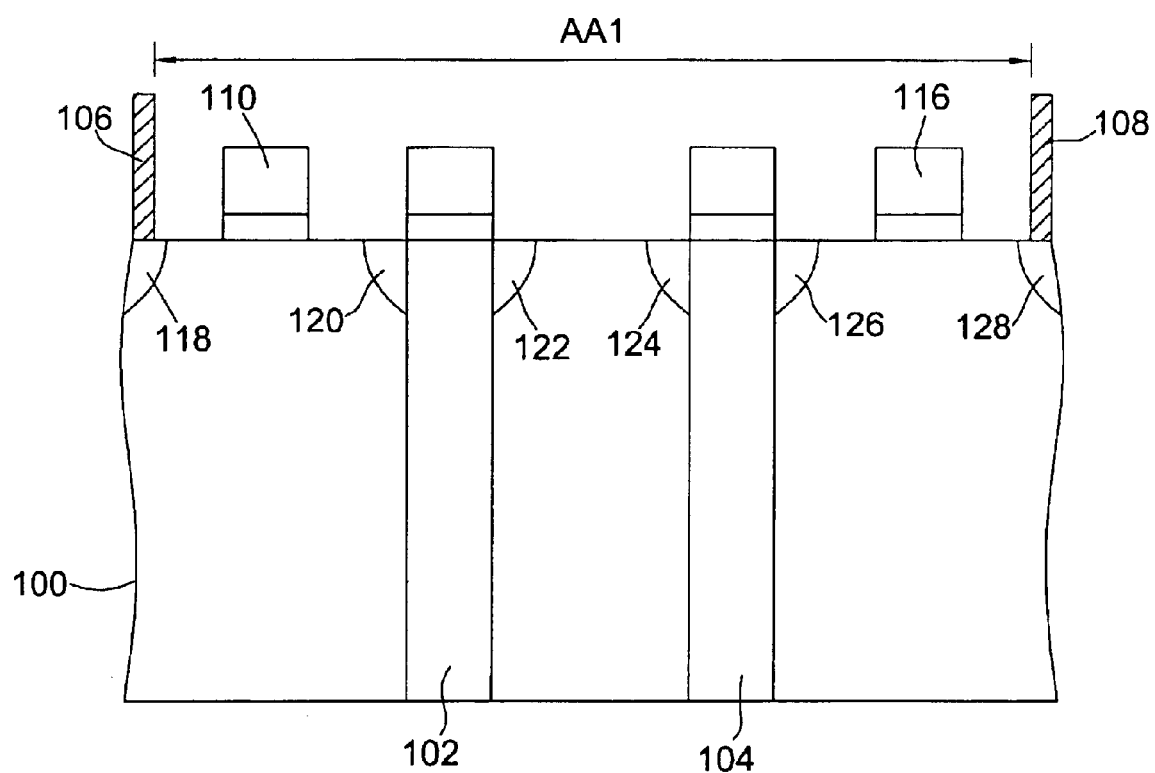
FIG. 1 shows the cross-sectional view of a test structure in the prior art.

Because the structure in FIG. 3 is formed by moving the fourth gate contact 116 to overlap with the first gate contact 10 in the previous test structure in FIG. 1, even when the buried strap in the third region 312 causes out diffusion, the charge of the Vt in Active Area AA2 will not be measured.

The above-mentioned descriptions are mainly focused on the left device in FIG. 3. Since the device on the right side is merely a mirror image of the device on the left side, the similarity of the structures can be easily deduced by persons skilled in the art, and therefore no more details are provided.

By means of the detailed descriptions of what is presently considered to be the most practical and preferred embodiments of the subject invention, it is the expectation that the features and the gist thereof are plainly revealed. Nevertheless, these above-mentioned illustrations are not intended to be construed in a limiting sense. Instead, it should be well understood that any analogous variation and equivalent arrangement is supposed to be covered within the spirit and scope to be protected and that the interpretation of the scope of the subject invention would therefore as much as broadly apply.

What is claimed is:

1. A test structure for use in DRAM comprising:
    a semiconductor substrate;
    a transistor formed on said semiconductor substrate, said transistor comprising a first region and a second region, both said first region and said second region being formed in said semiconductor substrate, said first region and said second region for use as source/drain regions of said transistor;
    a deep trench capacitor formed in said semiconductor substrate, said deep trench capacitor having a first width, said deep trench capacitor having a first side and a second side opposite to said first side, said transistor being on said first side of said deep trench capacitor;
    a shallow trench insulator (STI) formed in a top portion of said deep trench capacitor, said STI having a second width, wherein said second width is substantially shorter than said first width;
    a third region formed in said semiconductor substrate, said third region being on said second side of said deep trench capacitor;
    a first contact formed on said semiconductor substrate and contacting with said first region; and
    a second contact formed on said semiconductor substrate and contacting with said third region.

2. The test structure of claim 1, wherein said semiconductor substrate is a silicon substrate.

3. The test structure of claim 1, wherein said first region, said second region and said third region are formed by doping a dopant into said semiconductor substrate.

4. The test structure of claim 1, wherein said transistor contacts said first side of said deep trench capacitor and said third region contacts said second side of said deep trench capacitor.

5. The test structure of claim 1, wherein said transistor comprises a gate, said gate comprises a silicon oxide layer formed on said semiconductor substrate and an electric conductor layer formed on said silicon oxide layer.

6. The test structure of claim 5, wherein said electric conductor layer is a metal silicide layer.

7. The test structure of claim 1, further comprising two gate contacts formed on said semiconductor substrate and located on said deep trench capacitor.

8. The test structure of claim 7, wherein said gate contact comprising a silicon oxide layer formed on said semiconductor substrate and an electric conductor layer formed on said silicon oxide layer.

9. A test structure for use in DRAM comprising:
    a silicon substrate;
    a transistor formed on said silicon substrate, said transistor comprising a first region and a second region, both said first region and said second region being formed in said silicon substrate, said first region and said second region for use as source/drain regions of said transistor;
    a deep trench capacitor formed in said silicon substrate, said deep trench capacitor having a first width, said deep trench capacitor having a first side and a second side opposite to said first side, said transistor being on said first side of said deep trench capacitor;
    a shallow trench insulator (STI) formed in a top portion of said deep trench capacitor, said STI having a second width, and said second width being substantially shorter than said first width;
    two gate contacts formed on said silicon substrate and located on said deep trench capacitor, and said two gate contacts being separated by said STI;
    a buried strap formed in said silicon substrate, said buried strap being on said second side of said deep trench capacitor;
    a first contact formed on said silicon substrate and contacting with said first region; and
    a second contact formed on said silicon substrate and contacting with said buried strap.

10. The test structure of claim 9, wherein said gate contact comprising a silicon oxide layer formed on said silicon substrate and an electric conductor layer formed on said silicon oxide layer.

11. The test structure of claim 9, wherein said transistor contacts said first side of said deep trench capacitor and said buried strap contacts said second side of said deep trench capacitor.

12. The test structure of claim 9, wherein said transistor comprises a gate, said gate comprises a silicon oxide layer formed on said silicon substrate and an electric conductor layer formed on said silicon oxide layer.

13. The test structure of claim 12, wherein said electric conductor layer is a metal silicide layer.

* * * * *